(12) United States Patent
Walker

(10) Patent No.: US 9,355,207 B2
(45) Date of Patent: May 31, 2016

(54) PERFORMING STATIC TIMING ANALYSIS IN THE PRESENCE OF INSTANCE-BASED SYSTEMATIC VARIATIONS

(71) Applicant: FUJITSU LIMITED, Kawasaki-shi, Kanagawa (JP)

(72) Inventor: William W. Walker, Los Gatos, CA (US)

(73) Assignee: FUJITSU LIMITED, Kawasaki (JP)

( * ) Notice: Subject to any disclaimer, the term of this patent is extended or adjusted under 35 U.S.C. 154(b) by 28 days.

(21) Appl. No.: 14/296,264

(22) Filed: Jun. 4, 2014

(65) Prior Publication Data

US 2015/0356227 A1    Dec. 10, 2015

(51) Int. Cl.
 *G06F 17/50*    (2006.01)

(52) U.S. Cl.
 CPC ........ *G06F 17/5081* (2013.01); *G06F 17/5077* (2013.01)

(58) Field of Classification Search
 CPC .......................... G06F 17/5081; G06F 17/5077
 USPC ...................... 716/113, 108, 126, 134; 703/16
 See application file for complete search history.

(56) References Cited

U.S. PATENT DOCUMENTS

| | | | |
|---|---|---|---|
| 7,000,205 B2 | 2/2006 | Devgan et al. | |
| 7,487,475 B1 | 2/2009 | Kriplani et al. | |
| 8,302,047 B2 | 10/2012 | Buss et al. | |
| 8,732,640 B1 * | 5/2014 | Krishnan | G06F 17/5081 716/110 |
| 2003/0229476 A1 * | 12/2003 | Naganarayana | G05B 17/02 703/1 |
| 2006/0161411 A1 * | 7/2006 | Starr | G01M 7/08 703/14 |
| 2010/0131244 A1 * | 5/2010 | Murakawa | G06F 17/5018 703/1 |
| 2011/0202319 A1 * | 8/2011 | Weisz | G06F 17/5009 703/1 |
| 2013/0033277 A1 * | 2/2013 | Liao | G06F 17/5036 324/750.03 |
| 2014/0070841 A1 * | 3/2014 | Seningen | G06F 17/5045 326/16 |
| 2014/0075401 A1 * | 3/2014 | Seningen | G06F 17/5068 716/106 |
| 2015/0242547 A1 * | 8/2015 | Phadke | G06F 17/11 703/2 |

OTHER PUBLICATIONS

Kirkpatrick, T. I.; Clark, N. R., "Pert as an Aid to Logic Design," IBM Journal of Research and Development, vol. 10, No. 2, pp. 135,141, Mar. 1966.
McWilliams, T.M., "Verification of Timing Constraints on Large Digital Systems," Design Automation, 1980. 17th Conference on, vol., No., pp. 139,147, Jun. 23-25, 1980.

* cited by examiner

*Primary Examiner* — Phallaka Kik
(74) *Attorney, Agent, or Firm* — Maschoff Brennan

(57) ABSTRACT

A method may include obtaining gate-level circuit design data that describes a gate-level circuit design. The gate-level circuit design data may include one or more instances of each of multiple cells that each may be associated with a corresponding default cell static timing data and a corresponding default cell stress data. The method may include selecting one of the instances of one of the multiple cells, determining in-design stress data associated with the selected instance, and determining whether the in-design stress data is not within a tolerance of the default cell stress data. In response to the in-design stress data not being within the tolerance of the default cell stress data, the method may include generating in-design static timing data describing a timing performance for the selected instance and updating the gate-level circuit design data such that the selected instance is associated with the in-design static timing data.

20 Claims, 7 Drawing Sheets

PERFORMING STATIC TIMING ANALYSIS IN THE PRESENCE OF INSTANCE-BASED SYSTEMATIC VARIATIONS

FIELD

The embodiments discussed herein are related to performing static timing analysis in the presence of instance-based systematic variations.

BACKGROUND

Static Timing Analysis ("STA") has been used to calculate delays in synchronous digital systems and validate conformance to timing specifications. Enhancements have been added to STA. For example, enhancements have been added to the application of statistical methods to handle random process variations.

A basic assumption underlying STA algorithms is that a library of logic cells may be pre-characterized using, for example, a Simulation Program with Integrated Circuit Emphasis simulator ("SPICE simulator") to build cell models, and that these models may be used for each instance of a specific cell.

However, in deep sub-micron processes employing physical strain to enhance the mobility of Field-Effect Transistors ("FETs"), interaction between adjacent cell instances may significantly alter the carrier mobility of the same transistor in different instances of the same cell. This effect is illustrated in FIG. 1. Here, instance I1 and I2 of the same 2-in NOR have different MOSFET strain due to their differing interactions with neighbor cells; therefore, the 2-in NORs have different electrical characteristics in spite of having identical layouts. As a result, the cell-based modeling algorithm may break down. There are numerous approaches to alleviating this problem. Three approaches are described below.

A first approach is to simulate each cell in a variety of layouts and build a statistical model. A problem with this approach is that the individual instances have systematic variations, instead of random variations. Applying a statistical model to a problem with knowable systematic variation is overly pessimistic, resulting in larger cycle times or unnecessary padding of short paths.

A second approach is to simulate each cell in the minimum and maximum strain condition and build corner models. A problem with this approach is similar to the first approach described above: the strain of each instance is knowable from the layout, so applying a worst-case model is overly pessimistic, resulting in larger cycle times or unnecessary padding of short paths.

A third approach is to impose rigid design rules that equalize the strain on each FET so that a single timing model predicts the delay accurately for every instance. A problem with this approach is that it results in fixed FET size (gate array style) layouts resulting in suboptimal performance of the cell library compared to the less-constrained standard-cell style layout. This approach is illustrated in FIG. 2. In FIG. 2, assume that the transistors are the same width. Here, instance I1 and I2 of the same 2-in NOR have the same MOSFET strain and electrical characteristics due to their identical interactions with neighbor cells.

The subject matter claimed herein is not limited to embodiments that solve any disadvantages or that operate only in environments such as those described above. Rather, this background is only provided to illustrate one example technology area where some embodiments described herein may be practiced.

SUMMARY

A method may include obtaining gate-level circuit design data that describes a gate-level circuit design. The gate-level circuit design data may include one or more instances of each of multiple cells. Each cell of the multiple cells may be associated with a corresponding default cell static timing data, which is stored in a timing library, and a corresponding default cell stress data. The method may also include selecting one of the instances of one of the multiple cells and determining in-design stress data that describes one or more in-design stress parameters associated with the selected instance in the gate-level circuit design. The method may also include determining whether the in-design stress data is not within a tolerance of the default cell stress data associated with the selected instance. In response to the in-design stress data not being within the tolerance of the default cell stress data, the method may perform various acts. These acts may include generating in-design static timing data describing a timing performance for the selected instance in the gate-level circuit design based on the in-design stress data of the selected instance. Alternately or additionally, the acts may include appending the timing library with the in-design static timing data describing the timing performance associated with the selected instance and updating the gate-level circuit design data such that the selected instance is associated with the in-design static timing data during routing of the gate-level circuit design.

BRIEF DESCRIPTION OF THE DRAWINGS

Example embodiments will be described and explained with additional specificity and detail through the use of the accompanying drawings in which.

DESCRIPTION OF EMBODIMENTS

In digital Integrated Circuit design ("IC design"), physical synthesis is a step in the standard design cycle that follows the logic design. At this step, circuit representations of the components (devices and interconnects) of the design may be converted into geometric representations of shapes which, when manufactured in the corresponding layers of materials, may help to ensure proper functioning of the components. This geometric representation may be called "integrated circuit layout." Integrated circuit layout may be split into several sub-steps, which include both: (1) a design flow of the layout; and (2) verification of the layout.

The design flow of the layout describes the process and guidelines/framework for the physical synthesis phase of IC design. Physical synthesis flow may use technology that is provided by the fabrication houses. This technology may include data and information describing, among other things, the type of silicon wafer used, the layout rules, etc. The provided technology may be used to design standard logic cells, hereafter referred to as just "standard cells" or "cells," used by physical synthesis software. Alternatively, standard cell designs may be provided by the fabrication house.

The present disclosure relates to an improved design flow configured for improved static timing analysis in the presence of instance-based systematic variations. Embodiments of the present disclosure will now be explained with reference to the accompanying drawings.

Figure 1:
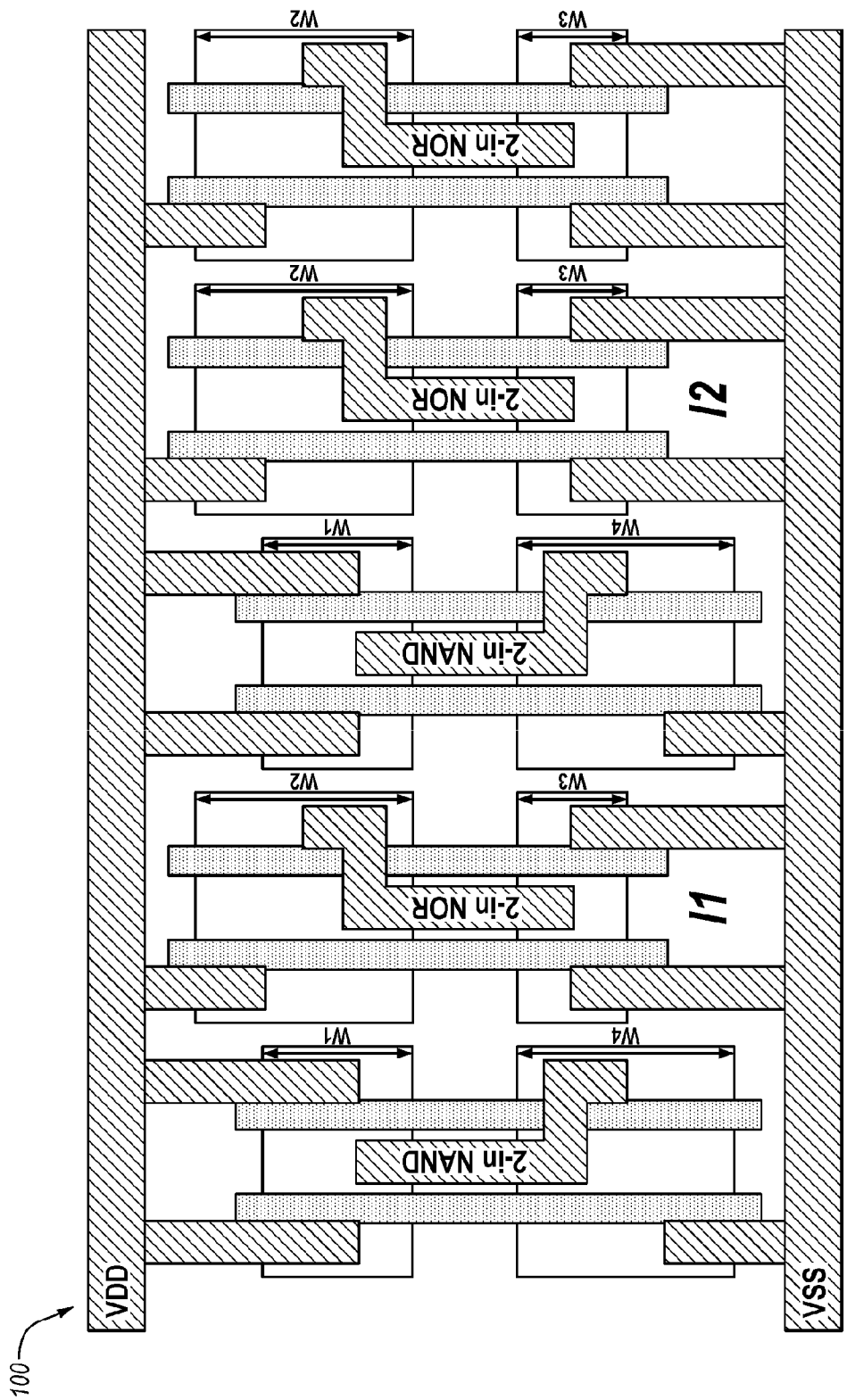
FIG. 1 illustrates an integrated circuit layout depicting differing neighbor interactions between two instances of the same standard cell.
Figure 2:
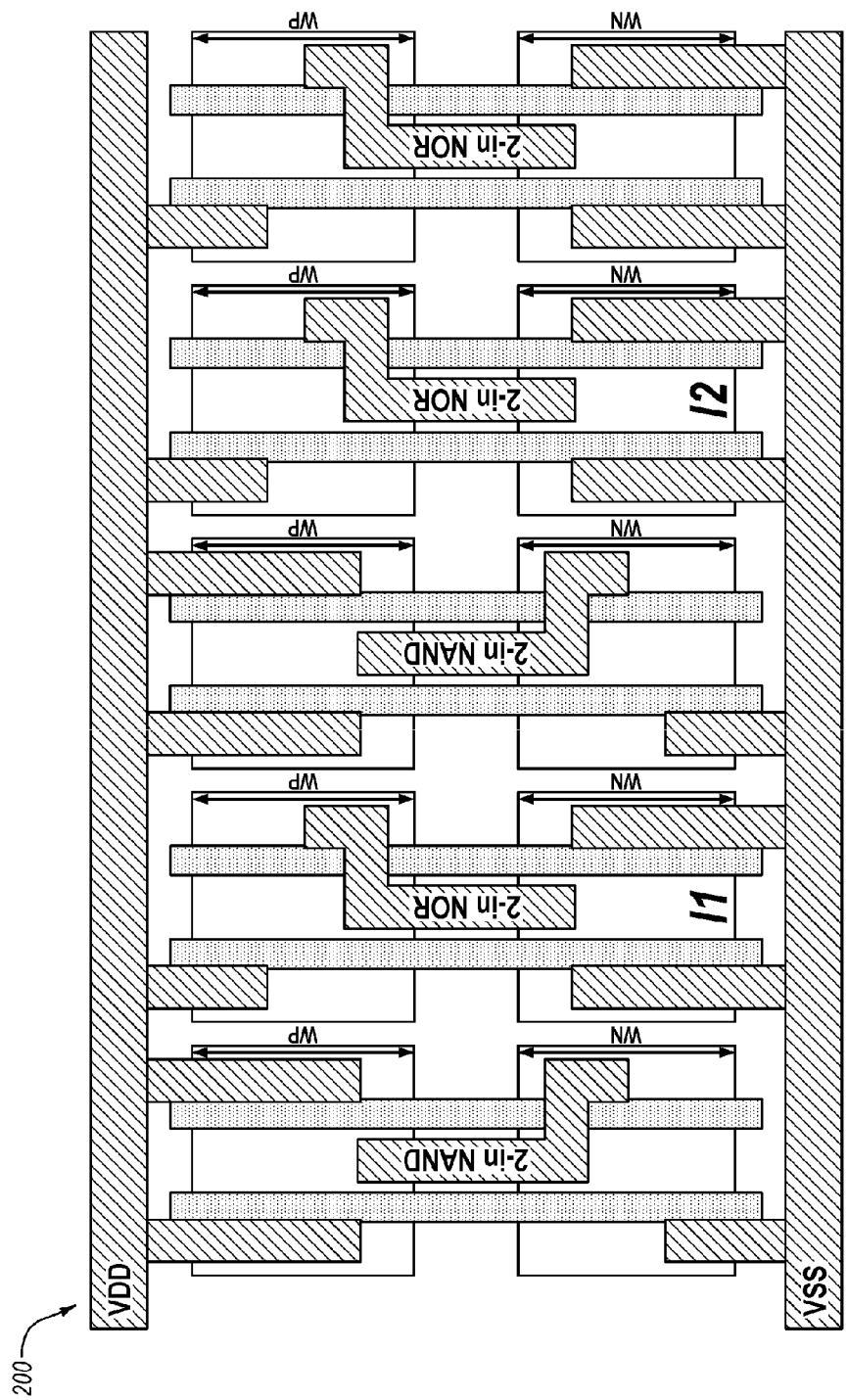
FIG. 2 illustrates an integrated circuit layout depicting an approach to impose design rules on standard cells to equalize the neighbor cell interactions of different instances independent of the actual neighbor cells.
Figure 3A:
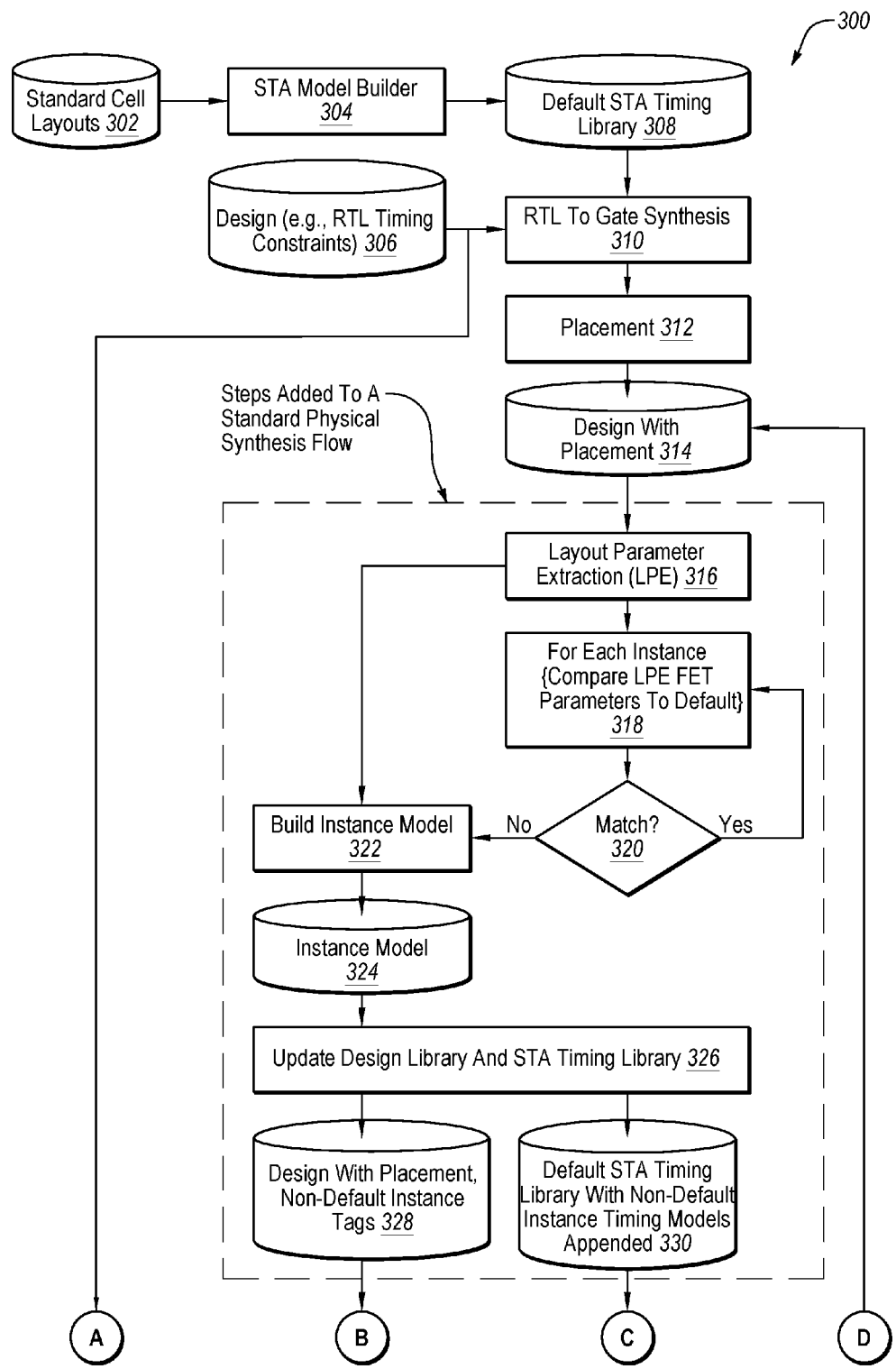
FIGS. 3A and 3B illustrate an example process flow diagram for a physical design flow configured for improved static timing analysis.
Figure 3B:
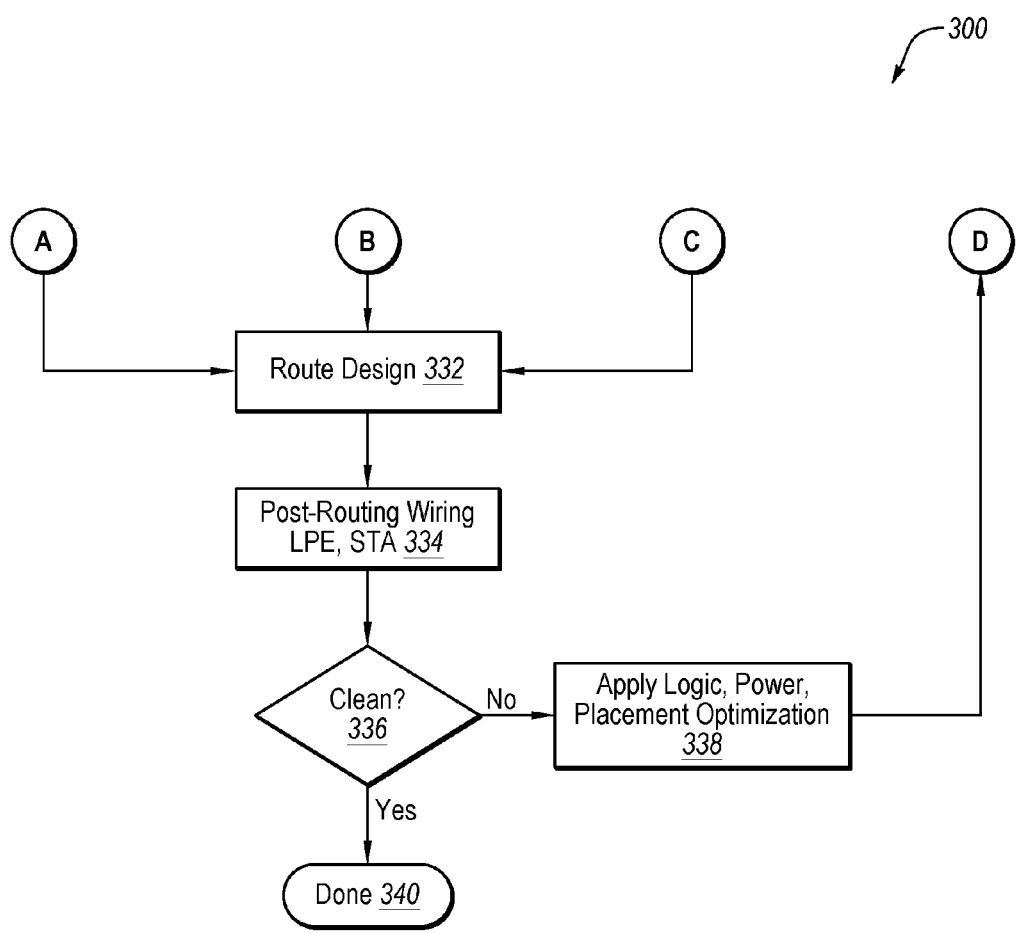

Referring now to FIGS. 3A and 3B, an example process flow 300 for a physical synthesis flow configured for improved static timing analysis is described, in accordance with at least one embodiment described herein. Although illustrated as discrete blocks, various blocks may be divided into additional blocks, combined into fewer blocks, or eliminated, depending on the desired implementation.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Element 302 may be cell layout data describing one or more standard cell layouts. Standard cells may be physical layouts of components that may be used in circuit design. The standard cells may be physical layouts of digital components that include one or more active or passive components, such as logic gates (e.g., INVERTER, AND, NOR, OR, NAND, XOR, FLIP_FLOPS, among other logic gates), as well as higher level digital circuit components such as arithmetic units register files, and memories. The standard cells may include one or more components. Each standard cell may be built from primitive devices, primarily FETS and metal wiring, but sometimes resistors, diodes, capacitors, inductors, and bipolar transistors.

The cell layout data 302 for a standard cell may describe the physical location and relationship between the components of the standard cell. Furthermore, the cell layout data 302 may include stress data for interactions between the components in the standard cell as well as default stress data for an assumed interaction with neighboring cells. The default stress data may be based on average or worst-case stress conditions associated with the interactions of the components of the standard cell with its neighbors.

The cell layout data 302 for the standard cells may be stored as a library of standard cell layouts. The cell layout data 302 may be used to generate default STA models for each of the standard cells using 304 STA Model Builder software. Each of the default STA models may be generated using the default stress data that correspond with each of the default STA models. As will be explained further below, additional STA models may also be built based on data extracted from instances of standard cells that are placed in a gate-level circuit design, which is represented by gate-level circuit design data, referred to herein as "circuit data". The circuit data may be based on the Design With Placement 314. In one implementation, the elements 302 and 308 of process flow 300 form a design library.

The process flow 300 may also include design data 306. The design data 306 may describe a logic design implemented by a user. For example, the design data 306 may be data describing a circuit designed by an engineer or programmer. The design data may describe a Register-Transfer Level ("RTL") logic implementation of a circuit. In some embodiments, the design RTL implementation of the circuit may be provided in HDL or synthesized into HDL from a higher-level language such as C. The design data 306 may include timing constraints that may be met by the physical synthesis flow.

The process flow 300 may further include building a 308 Default STA Timing Library (referred to herein as the "timing library 308") that may include timing data. The timing data may describe default STA timing for the cell layout data 302. In particular, the timing data may include STA timing for each of the standard cells in the cell layout data 302. The default STA timing for a standard cell may be based on the STA model for the standard cell that is built based on the cell layout data for the standard cell. For example, the default STA timing for a standard cell may describe the delay between each input and each output signal of a standard cell as a function of the input signal transition times and output signal loads, based on average or worst-case stress conditions associated with interactions between the components of the standard cell and its neighbors.

The process flow 300 may include logic synthesis 310. The default models may be used during logic synthesis and before placement. The logic synthesis 310 may include RTL to gate synthesis. Implementing the RTL logic using the cell layout data may be referred to mapping the RTL logic to a gate level netlist.

Elements 312 and 314 may include determining placement data describing the placement of one or more instances of one or more of the standard cells in a gate-level circuit design based on the logic synthesis 310. The placement of the one or more instances of the standard cells in a circuit design may be the physical location and the arrangement of the one or more instances of the standard cells with respect to one another as may be implemented in silicon for a gate-level circuit design that adheres to the design data 306. The output of elements 312 and 314 may be circuit data describing a gate-level circuit design that includes multiple instances of multiple standard cells, which are arranged and placed in a manner to implement the design in the design data 306. Each of the instances of the standard cells in the circuit data may include a tag that indicates which standard cell it is an instance of and thereby associating each instance of the standard cells with default STA timing associated with the standard cells. For example, the circuit data may include multiple instances of a first standard cell, multiple instances of a second standard cell, etc. Each of the instances of the first standard cell may have a tag that associates that instance with the first standard cell and the default STA timing of the first standard cell.

Elements 316-330 of process flow 300 may be added to a standard physical design flow to help to compensate for stress data of instances of standard cells after being placed in a gate-level circuit design that is different from default stress data for the standard cells. The elements 316-330 of the process flow 300 may help to compensate for changes in stress data by appending to the timing data 308 stored in the timing library, adding additional standard cells into the cell layout data 302, and/or updating the gate-level circuit design, and thus the circuit data, among other things.

In some implementations, the timing data 308 stored in the timing library may be appended to reflect the actual timing performance of the instances of the standard cells when used in the gate-level circuit design. In other words, the timing library is augmented to include non-default entries. For example, assume that instances of a standard cell layout referred to as "nor2" from the cell layout data 302 are used in the gate-level circuit design. Further, assume that the timing library includes timing data 308 labeled "nor2." The timing data labeled "nor2" may be associated with the standard cell layout referred to as "nor2." The timing data labeled "nor2" may describe the default timing performance for an instance of the standard cell layout referred to as "nor2" with a default neighbor interaction. The default timing performance may be the expected timing performance of an instance of the standard cell layout referred to as "nor2" provided its neighbor interaction matches the default neighbor interaction.

Further assume that that analysis by elements 316-324 of FIG. 3A of the instance of the standard cell layout "nor2," referred to as instance "i1," illustrates that instance "i1" includes neighbor interactions that results in the timing performance of instance "i1" being different than the default timing performance for the standard cell layout referred to as "nor2," upon which instance "i1" is based. In some implementations, elements 316-330 of FIG. 3A may enable the timing library to be updated to include timing data describing the actual timing performance for instance "i1." Similarly, a tag included in the circuit data for instance "i1" may be updated to include a tag associated with the actual timing performance for instance "i1," which may now be stored in the timing library.

At element 316, a set of in-design stress data may be extracted for each of or a subset of the instances of the standard cells as placed in the gate-level circuit design. Thus, the in-design stress data indicates actual stress for instances of standard cells based on the location of the instances of standard cells in the gate-level circuit design in relation to other instances of standard cells.

The in-design stress data may describe one or more first stress parameters. The first stress parameters may be associated with one or more components of each of the instances of the standard cells as placed in the gate-level circuit design. For example, the in-design stress data may include Layout Parameter Extraction ("LPE") parameters describing the first stress parameters.

At element 318, default stress data for each of or a subset of the instances of the standard cell in the gate-level circuit design may be retrieved. In some embodiments, the default stress parameters may describe a tolerance for instances of standard cells in the gate-level circuit design built based on the standard cells. For example, an instance of a standard cell in the gate-level circuit design may be built based on the standard cell, and the actual stress parameters for the instance of the standard cell in the gate-level circuit design may be analyzed to determine whether the actual stress parameters are within a tolerance of the default stress parameters associated with the standard cell. Elements 318 and 320 may include comparing the in-design stress data associated with the instances of standard cells to the default stress data associated with the standard cells to determine whether the first stress parameters described by the in-design stress data is within the tolerance for the default stress parameters described by the default stress data.

If there is no match at element 320, then one or more instance models may be built at elements 322 and 324. Elements 322 and 324 may include building in-design static timing data describing in-design timing performance associated with the instances of the standard cells.

Elements 326, 328, and 330 may include appending instance timing models to the default timing library to include the in-design static timing data describing the in-design timing performance associated with the instances of the standard cells. Elements 326, 328, and 330 may further include updating the tags included in the circuit data associated with the instances so that the tags re associated with the in-design static timing data describing the in-design timing performance associated with the instances of the standard cells that have in-design stress data that is not within the tolerance of the default stress data.

Referring now to FIG. 3B, element 332 may include routing the design for the instances of the standard cells and any other cells that form a circuit. One or more of the cells that form the circuit may have been processed according to elements 316-330 of FIG. 3A as described above.

Element 334 may include post-routing wiring and static timing analysis. The functionality of the circuit may be defined by the circuit logic whereas the static timing analysis checks the timing of the circuit. At step 336, a determination may be made regarding whether the circuit timing meets the timing constraints. If the circuit does not meet the timing constraints, then the process flow 300 may move to element 338. At element 338, the circuit data may be optimized and the process flow may move back to element 314 to perform elements 316-330 of FIG. 3A for one or more instances of the standard cells of the circuit data. The process flow 300 may end at element 340.

There are different alternative implementations for the process flow 300. Two example alternative implementations are described below.

According to a first example alternative implementation of the process flow 300, the timing library 308 may include two or more versions of default timing data for each standard cell based on how the standard cell may perform for different stress parameters. For example, for a standard cell, multiple different default stress layouts may be generated based on the different stresses for the standard cell. For each different default stress layout, STA models may be generated and used to generate the default timing data for each different default stress layout. In these and other embodiments, an instance of a standard cell may thus be associated with a default timing data of the standard cell during placement of instance. However, the instance may not be associated with default timing data that is most appropriate for the instance of the different default timing data of the standard cell based on the placement of the instance in the gate-level circuit design.

In these and other embodiments, during the method 400, the elements 318 and 320 may indicate that the in-design stress parameters for an instance of a standard cell are not within the tolerance for the default stress parameters associated with the instance of the standard cell.

For example, element 320 may be modified to further include determining which of the two or more versions of the timing data of the standard cell is a closest match to an in-design timing data of an instance of a standard cell in the gate-level circuit design based on comparing the in-design stress parameters of the instance to the different default stress parameters of the standard cell. In short, the element 320 may be modified to also determine for an instance of a standard cell which of the versions of the timing data of the standard cell stored in the timing library is closest to predicting the timing of the instance of the standard cell. The circuit data may be updated such that the instance points to the version of the timing data of the standard cell stored in the timing library that most closely matches the in-design timing data of the instance.

In some embodiments, the process flow 300 may incorporate both the alternative implementation of the process flow 300 discussed directly above and the process flow 300 discussed previously. In these and other embodiments, each standard cell may include a stress cell layout with default timing data. When in-design stress data of an instance of a standard cell is not within a particular tolerance of the default stress data of the standard cell, the process flow 300 may associate the instance with in-design timing data generated based on the in-design stress data. The process flow 300 may also store the in-design stress data as another version of the standard cell. In subsequent iterations, the process flow 300 may first compare in-design stress data of an instance with different versions of the standard cell. When the in-design stress data is within a tolerance of one of the different versions of the standard cell, the process flow 300 may use the one of the different versions for the instance. When the in-design stress data is not within a tolerance of any of the different versions of the standard cell, the process flow 300 may generate in-design timing data based on the in-design stress data and save the in-design stress data as another version of the standard cell.

According to a second example alternative implementation for the process flow 300, the process flow 300 may be configured to complete standard physical synthesis flow for each cell of a circuit through to the post-routing steps depicted as elements 334 and 336 of FIG. 3B. In other words, elements 316-330 are initially skipped for each instance of the standard cells included in a gate-level circuit design. After element 334, a new step is added to the process flow 300 to determine which instances included in the gate-level circuit design did not perform within a specified timing tolerance of the default STA timing for the standard cell. Only those instances that are not within the specified timing tolerance of the default STA timing for the standard cell may be processed according to elements 316-330.

In another variation, a new step is added to the process flow 300 to determine which data and/or clock path included in the gate-level circuit design did not perform within a specified timing tolerance for the gate-level circuit design. In these and other embodiments, instances of standard cells in the data and/or clock paths that did not perform within the specified timing tolerance may be processed according to elements 316-330. This implementation of process flow 300 may be beneficial because other instances that are not included in the data and/or clock paths included in the gate-level circuit design that did not perform within the specified timing tolerance may not to be processed according to elements 316-330.

Figure 4:
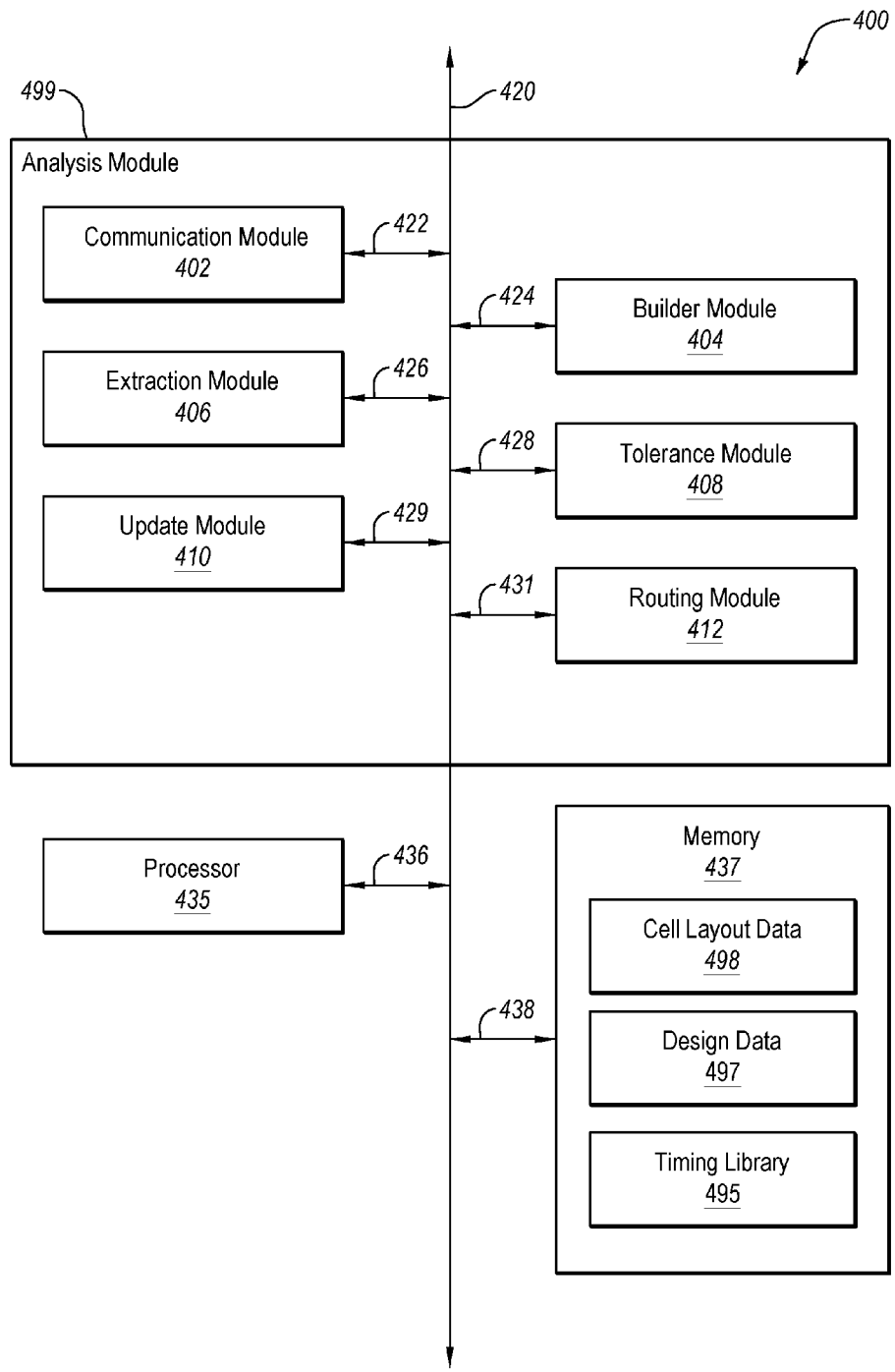
FIG. 4 illustrates a block diagram depicting an example analysis module.

Referring now to FIG. 4, an example of an analysis module 499 is illustrated, in accordance with at least one embodiment described herein. FIG. 4 is a block diagram of a computing device 400 that includes the analysis module 499, a processor 435 and a memory 437 according to some examples. The components of the computing device 400 are communicatively coupled by a bus 420. In some implementations, the analysis module 499 configured to provide the functionality described above with reference to FIGS. 3A and 3B and process flow 300. In some implementations, the analysis module 499 is configured to provide the functionality described below with reference to method 500 and FIG. 5. In yet other implementations, the analysis module 499 is configured to provide the functionality described below with reference to method 600 and FIG. 6.

The processor 435 may include an arithmetic logic unit, a microprocessor, a general-purpose controller, or some other processor array to perform computations and provide electronic display signals to a display device. The processor 435 is coupled to the bus 420 for communication with the other components via signal line 436. The processor 435 may process data signals and may include various computing architectures including a complex instruction set computer (CISC) architecture, a reduced instruction set computer (RISC) architecture, or an architecture implementing a combination of instruction sets. Although FIG. 4 includes a single processor 435, multiple processors may be included. Other processors, operating systems, sensors, displays, and physical configurations may be possible.

The memory 437 may store instructions or data that may be executed by the processor 435. The memory 437 may be coupled to the bus 420 for communication with the other components via signal line 438. The instructions or data may include code for performing the techniques described herein. For example, the memory 437 stores all the instructions or data necessary for the analysis module 499 to provide its functionality as described herein with reference to process flow 300, method 500, or method 600. In some implementations, one or more of the sub-modules 402-412 of the analysis module 499 may be stored in the memory 437.

In the depicted implementation, the memory 437 stores cell layout data 498, design data 497, and a timing library 495.

The cell layout data 498 may include information or data used to build one or more standard cells. The cell layout data 498 may be configured to generate default STA models using average or worst-case stress conditions. For example, the cell layout data may include data and information configured to build one or more default cell models that may be used during logic synthesis and before placement.

The design data 497 may include data describing a circuit design implemented by a user. For example, the design data 497 is data describing a circuit designed by an engineer or programmer. The design data may describe a RTL logic implementation of a circuit. In some embodiments, the design RTL implementation of the circuit may be provided in HDL or synthesized into HDL from a higher-level language such as C. In some embodiments, the design data 306 may include, for example, RTL timing constraints.

The timing library 495 may include timing data associated with each standard cell. In particular, the timing library 495 may include timing data describing default STA timing for each standard cell. In some implementations, the timing data describes the timing performance of one or more of the models described by the cell layout data 498. The timing data may also be associated with a non-default cell or a non-default model.

In the implementation illustrated in FIG. 4, the analysis module 499 includes a communication module 402, a builder module 404, an extraction module 406, a tolerance module 408, an update module 410, and a routing module 412. These components of the analysis module 499 may be communicatively coupled to each other via the bus 420. One or more of the components of the analysis module 499 may be stored in the memory 437 or executed by the processor 435.

The communication module 402 may be communicatively coupled to the bus 420 via signal line 422. The builder module 404 may be communicatively coupled to the bus 420 via signal line 424. The extraction module 406 may be communicatively coupled to the bus 420 via signal line 426. The tolerance module 408 may be communicatively coupled to the bus 420 via signal line 428. The update module 410 may be communicatively coupled to the bus 420 via signal line 429. The routing module 412 may be communicatively coupled to the bus 420 via signal line 431.

The communication module 402 may be software including routines for handling communications between the analysis module 499 and other components of the computing device 400. In some implementations, the communication module 402 may be a set of instructions executable by the processor 435 to provide the functionality described below for handling communications between the analysis module 499 and other components of the computing device 400. In some instances, the communication module 402 may be stored in the memory 437 of the computing device 400 and may be accessible and executable by the processor 435.

The communication module 402 may send and receive data to and from one or more processor-based computing devices.

In some implementations, the communication module 402 may receive data from components of the analysis module 499 and may store the data in the memory 437. In some implementations, the communication module 402 may retrieve data from the memory 437 and may send the data to one or more appropriate components of the analysis module 499. For example, the memory 437 may store timing data and the communication module 402 may retrieve timing data from the memory 437. In some implementations, the communication module 402 may receive data from one or more appropriate components of the analysis module 499 or the memory 437 and may send the data to other components of a system communicatively coupled to the computing device 400. The communication module 402 may be adapted for cooperation and communication with the processor 435 and other components of the computing device 400 via signal line 422.

The builder module 404 may be software including routines configured to build circuit data. The circuit data may be built using the cell layout data 498. The circuit data may describe a gate-level circuit design for a cell including one or more components. The circuit data may describe the gate-level circuit design for one or more cells.

The circuit data may include a tag associated with a default timing performance associated with a standard cell in the circuit data. The default timing performance may be referred to as "default STA timing." The tag may point to an entry of timing data stored in the timing library 495. The builder module 404 may communicate with the communication module 402 to retrieve data from the memory 437 or store data on the memory 437.

The extraction module 406 may be software including routines configured to determine in-design stress data of instances of standard cells in the circuit data. The in-design stress data may describe one or more in-design stress parameters associated with each of the instances. The extraction module 406 may communicate with the communication module 402 to retrieve data from the memory 437 or store data on the memory 437.

The tolerance module 408 may be software including routines configured to retrieve default stress data for a standard cell and determine whether the in-design stress data of an instance of the standard cell is within a tolerance of the default stress data. The tolerance module 408 may determine that the in-design stress data is not within a tolerance of default stress data by comparing default stress parameters associated with the standard cell with the in-design stress parameters of the instance of the standard cell.

The tolerance module 408 may communicate with the communication module 402 to signal the builder module 404 to build static timing data for instance responsive to the tolerance module 408 determining that the in-design stress data of the instance is not within a tolerance of the default stress data. The builder module 404 may build in-design static timing data describing an in-design timing performance associated with the instance.

In some implementations, the tolerance module 408 may determine which instances in a gate-level circuit design are included in a critical path of the gate-level circuit design. The tolerance module 408 may determine whether a critical path for the gate-level circuit design may be optimized. The tolerance module 408 may communicate with the communication module 402 to retrieve data from the memory 437 or store data on the memory 437.

The update module 410 may be software including routines configured to update the timing library 495 to include the in-design static timing data. The in-design static timing data stored in the timing library 495 may be associated with the instance. The update module 410 may also be configured to update the tag included in the circuit data for the instance so that the tag is associated with the in-design static timing data stored in the timing library 495. The update module 410 may communicate with the communication module 402 to retrieve data from the memory 437 or store data on the memory 437.

The routing module 412 may be software including routines configured to route a circuit including one or more in-design of standard cells. The routing module 412 may be configured to perform the post-routing wiring for the circuit. The routing module 412 may be configured to apply logic, power, or placement optimization for the circuit. The routing module 412 may communicate with the communication module 402 to retrieve data from the memory 437 or store data on the memory 437.

In some implementations, the functionality of the analysis module 499 may beneficially eliminate or reduce systematic timing errors caused by cell interactions. The analysis module 499 may also eliminate or reduce the performance and power penalty associated with suboptimal FET sizing in the standard cell library.

Figure 5:
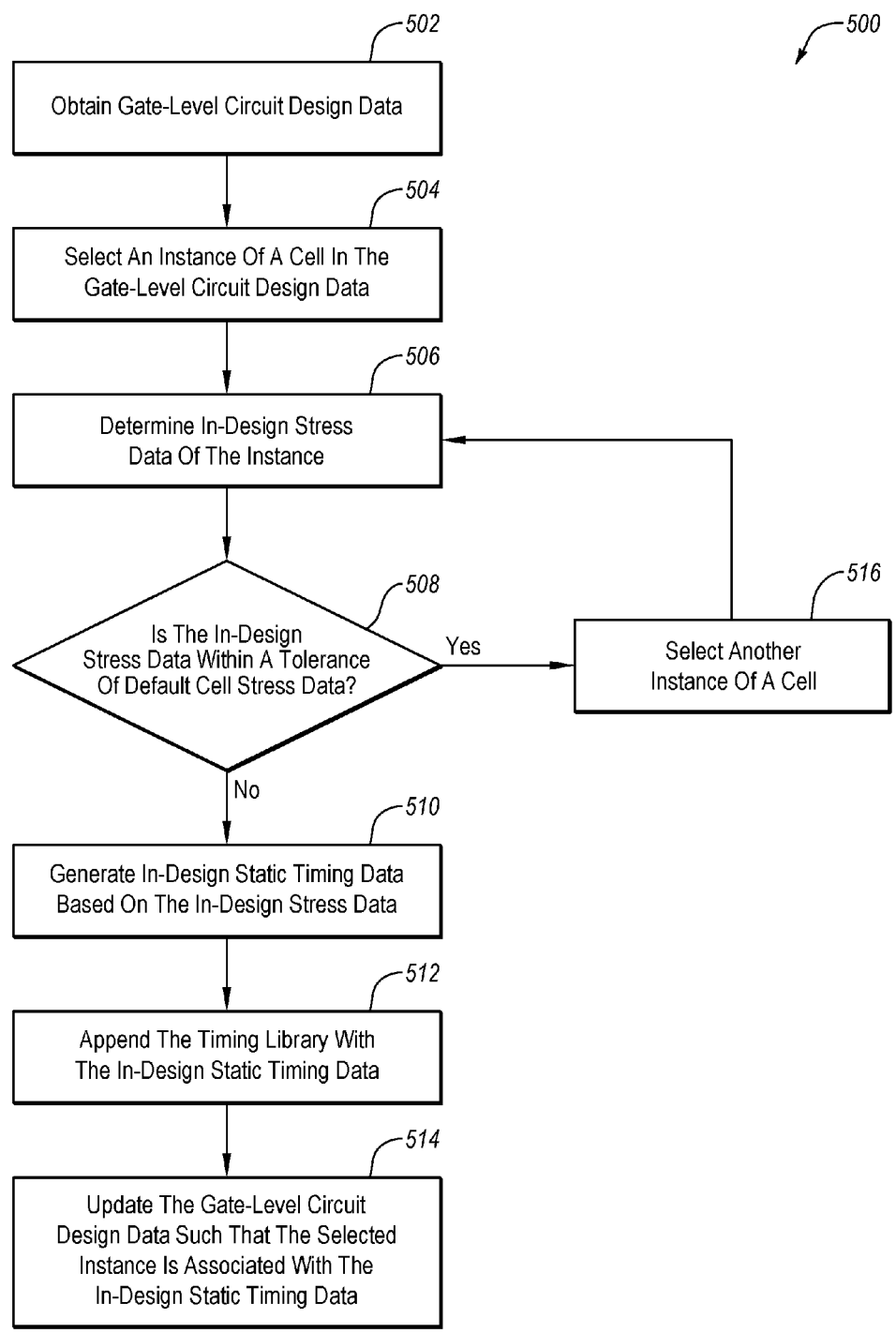
FIG. 5 illustrates an example method for a physical design flow.

Referring now to FIG. 5, an example method 500 for a physical design flow is described, in accordance with at least one embodiment described herein. The method 500 may be implemented, in some embodiments, by a computing device, such as the computing device 400 of FIG. 4. Although illustrated as discrete blocks, various blocks may be divided into additional blocks, combined into fewer blocks, or eliminated, depending on the desired implementation.

In the illustrated implementation of FIG. 5, the method 500 may begin at block 502 where gate-level circuit design data may be obtained. The gate-level circuit design data may describe a gate-level circuit design and include one or more instances of each of multiple cells. Each cell may be associated with a corresponding default cell static timing data, which is stored in a timing library, and a corresponding default cell stress data.

In some embodiments, the default cell static timing data may be data indicating time for a signal to traverse components included in a cell. For example, default cell static timing data may indicate time for a signal to pass from an input to an output of the cell. The default cell static timing data associated with each of the cells may be stored in the timing library and may be used to generate a default timing performance associated with each cell.

At block 504, the method 500 may select one of the instances of one of the cells. At block 506, the method 500 may determine in-design stress data that describes one or more in-design stress parameters associated with the selected instance in the gate-level circuit design. In some embodiments, the in-design stress parameters may describe physical interactions of the selected instance with one or more other instances of the cells or others of the cells.

At block 508, the method 500 may determine whether the in-design stress data is within a tolerance of the default cell stress data associated with the selected instance. In some embodiments, the default cell stress data may describe one or more default stress parameters associated with the selected instance. In these and other embodiments, the tolerance may be met if the in-design stress parameters match the default stress parameters. Alternately or additionally, the tolerance may be met when the in-design stress parameters are plus or minus 10% of the default stress parameters or any other threshold defined by a user or system.

When it is determined that the in-design stress data is not within a tolerance of the default cell stress data associated with the selected instance, the method 500 may proceed to block 510. When it is determined that the in-design stress data is within a tolerance of the default cell stress data associated with the selected instance, the method 500 may proceed to block 516.

At block 510, the method 500 may include generating in-design static timing data. The in-design static timing data may describe a timing performance for the selected instance in the gate-level circuit design based on the in-design stress data of the selected instance.

At block 512, the method 500 may include appending the timing library with the in-design static timing data describing the timing performance associated with the selected instance. In some embodiments, appending in-design static timing data to the timing library may beneficially improve the timing library by ensuring that the timing library includes accurate timing data for the selected instance.

At block 514, the method 500 may include updating the gate-level circuit design data such that the selected instance is associated with the in-design static timing data during routing of the gate-level circuit design. In some embodiments, updating the gate-level circuit design data may include updating a tag in the gate-level circuit design data associated with the selected instance such that the tag is associated with the in-design static timing data in the timing library.

At block 516, the method 500 may include selecting another one of the instances of the one of the cells. Alternately or additionally, when there is not another instance of the one of the multiple cells, an instance of another of the multiple cells may be selected. The method 500 may proceed back to block 506 and continue for other instances in the gate-level circuit design data. In some embodiments, blocks 506 and 508 may be performed for every instance in the gate-level circuit design data.

One skilled in the art will appreciate that, for this and other processes and methods disclosed herein, the functions performed in the processes and methods may be implemented in differing order. Furthermore, the outlined acts and operations are only provided as examples, and some of the steps and operations may be optional, combined into fewer acts and operations, or expanded into additional acts and operations without detracting from the essence of the disclosed embodiments.

For example, in some embodiments, before block 504, the method 500 may further include routing the gate-level circuit design data and selecting a path through the routed gate-level circuit design data. In these and other embodiments, the selected instance of the one of the multiple cells may be selected from the selected path. In some embodiments, the method 500 may further include determining a timing performance for one or more paths through the routed gate-level circuit design data. In these and other embodiments, the selected path may be one of the one or more paths that may be outside a specified timing tolerance based on the timing performance of the one or more paths. The specified timing tolerance may be specified by a human user such as the human who wrote the RTL for the circuit. In these and other embodiments, the paths that do not meet specified timing tolerances may be referred to as critical timing paths, e.g., paths that may result in the circuit not achieving timing standards. In these and other embodiments, the instances in the critical timing paths may be checked for in-design stress data that may not be within a tolerance of the default cell stress data. By adjusting the in-design static timing data for the instances in the critical timing paths a more accurate understanding of the timing of the critical timing paths may be achieved which may assist in handling the critical timing paths.

Figure 6:
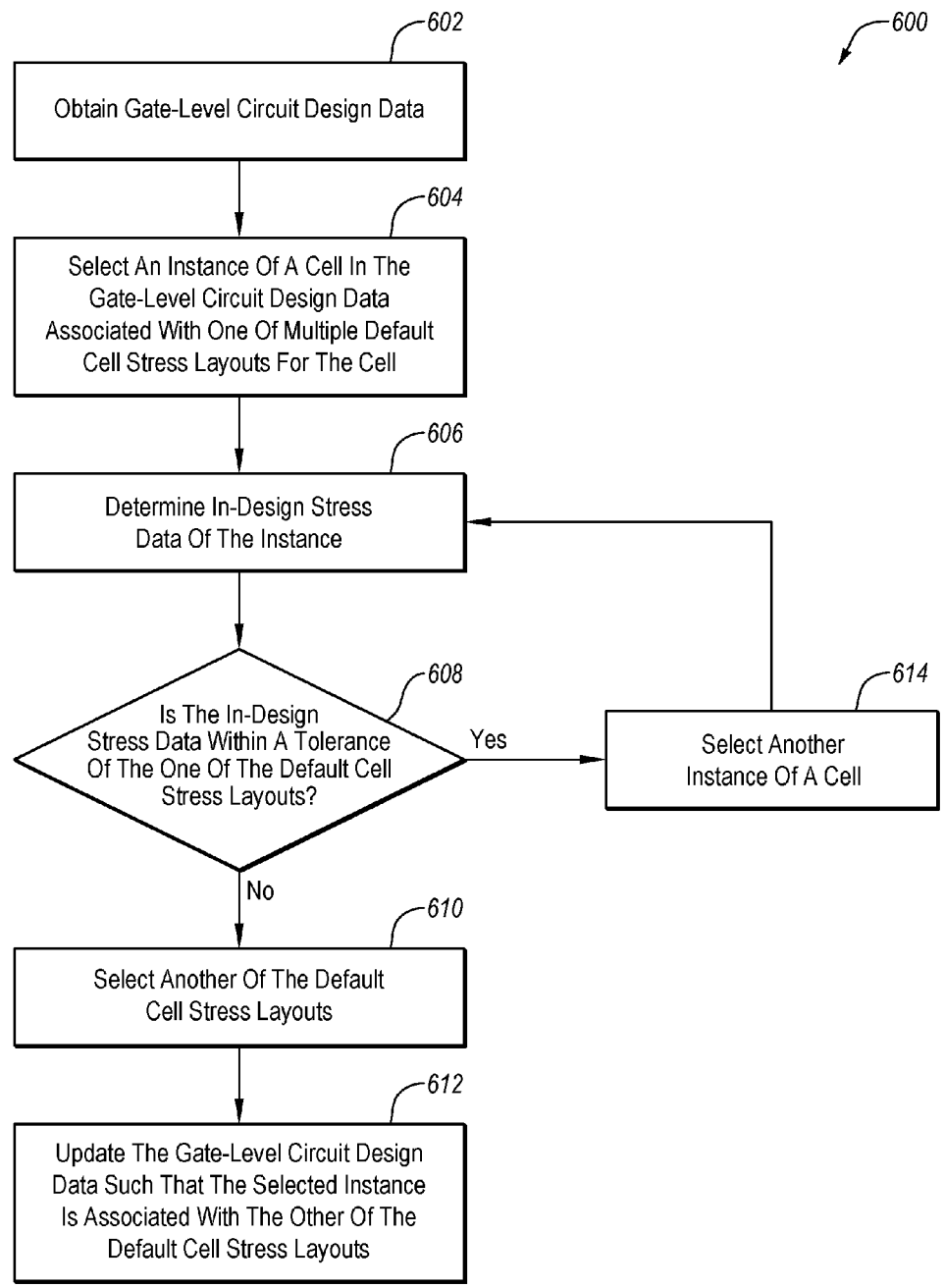
FIG. 6 illustrates another example method for a physical design flow.

Referring now to FIG. 6, an example method 600 for a physical design flow configured to improve static timing analysis is described, in accordance with at least one embodiment described herein. The method 600 may be implemented, in some embodiments, by a computing device, such as the computing device 400 of FIG. 4, among other systems. Although illustrated as discrete blocks, various blocks may be divided into additional blocks, combined into fewer blocks, or eliminated, depending on the desired implementation.

In the illustrated implementation of FIG. 6, the method 600 may begin at block 602 where gate-level circuit design data may be obtained. The gate-level circuit design data may include one or more instances of each of multiple cells. In some embodiments, each of the cells may be associated with multiple default cell stress layouts and their corresponding cell static timing data.

At block 604, the method 600 may include selecting one of the instances of one of the cells. The selected instance may be associated with one of the default cell stress layouts for the one of the cells. For example, if a cell has ten different default cell stress layouts, the instance of the cell may be associated with one of the ten different default cell stress layouts. In some embodiments, all or a majority of the instances of a cell may be associated with a single default cell stress layout of a cell after the gate-level circuit design is created. Alternately or additionally, as the gate-level circuit design is created, each of the instances of the cell may be associated with one of the default cell stress layouts of the cell that is determined to be most appropriate for the instance of the cell based on the positioning of the instance and its surrounding instances.

At block 606, the method 600 may include determining in-design stress data that describes one or more in-design stress parameters associated with the selected instance in the gate-level circuit design. In some embodiments, the in-design stress parameters may describe physical interactions of the selected instance with one or more other instances of the one of the cells or one or more other instances of others of the cells.

At block 608, the method 600 may include determining whether the in-design stress data is within a tolerance of the one of the default cell stress layouts associated with the selected instance. In some embodiments, determining whether the in-design stress data is within the tolerance of the one of the default cell stress layouts associated with the selected instance may include comparing the in-design stress parameters to layout stress parameters of the one of the default cell stress layouts associated with the selected instance and determining whether the in-design stress parameters match the layout stress parameters within a tolerance. An example of the tolerance may be the in—in-design stress parameters being within plus or minus 10% of the layout stress parameters or any other threshold defined by a user or system.

When it is determined that the in-design stress data is not within a tolerance of the one of the default cell stress layouts associated with the selected instance, the method 600 may proceed to block 610. When it is determined that the in-design stress data is within a tolerance of the one of the default cell stress layouts associated with the selected instance, the method 600 may proceed to block 614.

At block 610, the method 600 may include selecting another of the default cell stress layouts based on the in-design stress data of the selected instance. For example, the layout stress parameters of each of the default cell stress layouts may be compared to the in-design stress parameters of the selected instance. The layout stress parameters of the default cell stress layout that matches or that is closest to matching the in-design stress parameters of the selected instance may be determined and the corresponding default cell stress layout may be selected as the other of the default cell stress layouts.

At block 612, the method 600 may include updating the gate-level circuit design data such that the selected instance is associated with the other of the default cell stress layouts and its corresponding cell static timing data during routing of the gate-level circuit design. In some embodiments, updating the gate-level circuit design data may include updating a tag in the gate-level circuit design data associated with the selected instance such that the tag is associated with the other of the default cell stress layout.

At block 614, the method 600 may include selecting another of the instances of the one of the cells. Alternately or additionally, when there is not another instance of the one of the cells, an instance of another of the cells may be selected. The method 600 may proceed back to block 606 and continue for other instances in the gate-level circuit design data. In some embodiments, blocks 606 and 608 may be performed for every instance in the gate-level circuit design data.

One skilled in the art will appreciate that, for this and other processes and methods disclosed herein, the functions performed in the processes and methods may be implemented in differing order. Furthermore, the outlined acts and operations are only provided as examples, and some of the steps and operations may be optional, combined into fewer acts and operations, or expanded into additional acts and operations without detracting from the essence of the disclosed embodiments.

For example, in some embodiments, before block 604, the method 600 may further include routing the gate-level circuit design data and selecting a path through the routed gate-level circuit design data. In these and other embodiments, the selected instance of the one of the cells is selected from the selected path. In some embodiments, the method 600 may further include determining a timing performance for one or more paths through the routed gate-level circuit design data. In these and other embodiments, the selected path may be one of the one or more paths that may be outside a specified timing tolerance based on the timing performance of the one or more paths.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may include tangible and/or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions include, for example, instructions and data which cause a general purpose computer, special purpose computer, or special purpose processing device (e.g., one or more processors) to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module" or "component" may refer to specific hardware implementations configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the system and methods described herein are generally described as being implemented in software (stored on and/or executed by general purpose hardware), specific hardware implementations or a combination of software and specific hardware implementations are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it may be understood that the various changes, substitutions, and alterations could be made hereto without departing from the spirit and scope of the invention.

What is claimed is:

1. A method comprising:
   obtaining, using a computing system, gate-level circuit design data that describes a gate-level circuit design, the gate-level circuit design data including one or more instances of each of a plurality of cells, wherein each cell of the plurality of cells is associated with a corresponding default cell static timing data, which is stored in a timing library, and a corresponding default cell stress data;
   selecting, using the computing system, one of the instances of one of the plurality of cells;

determining, using the computing system, in-design stress data that describes one or more in-design stress parameters associated with the selected instance in the gate-level circuit design;

determining, using the computing system, whether the in-design stress data is not within a tolerance of the default cell stress data associated with the selected instance;

in response to the in-design stress data not being within the tolerance of the default cell stress data, the method further comprises:

generating, using the computing system, in-design static timing data describing a timing performance for the selected instance in the gate-level circuit design based on the in-design stress data of the selected instance;

appending, using the computing system, the timing library with the in-design static timing data describing the timing performance associated with the selected instance;

updating, using the computing system, the gate-level circuit design data such that the selected instance is associated with the in-design static timing data during routing of the gate-level circuit design; and generating, using the computing system, an integrated circuit layout to fabricate an integrated circuit based on the updated gate-level circuit design data.

2. The method of claim 1, wherein updating the gate-level circuit design data includes updating a tag in the gate-level circuit design data associated with the selected instance such that the tag is associated with the in-design static timing data in the timing library.

3. The method of claim 1, wherein the in-design stress parameters describe physical interactions of the selected instance with one or more other instances of the one of the plurality of cells or others of the plurality of cells.

4. The method of claim 1, wherein in response to the in-design stress data being within the tolerance of the default cell stress data, the method further comprises selecting another one of the instances of the one of the plurality of cells.

5. The method of claim 1, wherein the default cell stress data describes one or more default stress parameters associated with the selected instance, wherein determining whether the in-design stress data is not within the tolerance of the default cell stress data includes comparing the in-design stress parameters to the default stress parameters and determining that the in-design stress parameters do not match the default stress parameters such that the in-design static timing data of the selected instance does not match the default cell static timing data of the selected instance.

6. The method of claim 1, wherein before selecting one of the instances of one of the plurality of cells, the method further comprises:

routing the gate-level circuit design data; and selecting a path through the routed gate-level circuit design data, wherein the selected instance of the one of the plurality of cells is selected from the selected path.

7. The method of claim 6, further comprising determining a timing performance for one or more paths through the routed gate-level circuit design data, wherein the selected path is one of the one or more paths that is outside a specified timing tolerance based on the timing performance of the one or more paths.

8. A system comprising:

a processor; and a non-transitory memory storing instructions that, when executed by the processor, cause the system to perform operations comprising:

obtaining gate-level circuit design data that describes a gate-level circuit design, the gate-level circuit design data including one or more instances of each of a plurality of cells, wherein each cell of the plurality of cells is associated with a corresponding default cell static timing data, which is stored in a timing library, and a corresponding default cell stress data;

selecting one of the instances of one of the plurality of cells;

determining in-design stress data that describes one or more in-design stress parameters associated with the selected instance in the gate-level circuit design;

determining whether the in-design stress data is not within a tolerance of the default cell stress data associated with the selected instance;

in response to the in-design stress data not being within the tolerance of the default cell stress data, the operations further comprise:

generate in-design static timing data describing a timing performance for the selected instance in the gate-level circuit design based on the in-design stress data of the selected instance;

appending the timing library with the in-design static timing data describing the timing performance associated with the selected instance;

updating the gate-level circuit design data such that the selected instance is associated with the in-design static timing data during routing of the gate-level circuit design and generating an integrated circuit layout to fabricate an integrated circuit based on the updated gate-level circuit design data.

9. The system of claim 8, wherein updating the gate-level circuit design data includes updating a tag in the gate-level circuit design data associated with the selected instance such that the tag is associated with the in-design static timing data in the timing library.

10. The system of claim 8, wherein in response to the in-design stress data being within the tolerance of the default cell stress data, the operations further comprise selecting another one of the instances of the one of the plurality of cells.

11. The system of claim 8, wherein the default cell stress data describes one or more default stress parameters associated with the selected instance, wherein the tolerance is met if the in-design stress parameters match the default stress parameters.

12. The system of claim 8, wherein the default cell stress data describes one or more default stress parameters associated with the selected instance, wherein determining that the in-design stress data is not within the tolerance of the default cell stress data includes comparing the in-design stress parameters to the default stress parameters and determining that the in-design stress parameters do not match the default stress parameters such that the in-design static timing data of the selected instance does not match the default cell static timing data of the selected instance.

13. The system of claim 8, wherein before selecting one of the instances of one of the plurality of cells, the operations further comprise:

routing the gate-level circuit design data; and selecting a path through the routed gate-level circuit design data, wherein the selected instance of the one of the plurality of cells is selected from the selected path.

14. The system of claim 13, wherein the operations further comprise determining a timing performance for one or more paths through the routed gate-level circuit design data, wherein the selected path is one of the one or more paths that is outside a specified timing tolerance based on the timing performance of the one or more paths.

15. A method comprising:
obtaining, using a computing system, gate-level circuit design data that describes a gate-level circuit design, the gate-level circuit design data including one or more instances of each of a plurality of cells, wherein each cell of the plurality of cells is associated with a plurality of default cell stress layouts and their corresponding cell static timing data;
selecting, using the computing system, one of the instances of one of the plurality of cells, wherein the selected instance is associated with one of the plurality of default cell stress layouts for the one of the plurality of cells for which the instance is selected;
determining, using the computing system, in-design stress data that describes one or more in-design stress parameters associated with the selected instance in the gate-level circuit design;
determining, using the computing system, whether the in-design stress data is not within a tolerance of the one of the plurality of default cell stress layouts associated with the selected instance;
in response to the in-design stress data not being within the tolerance of the one of the plurality of default cell stress layouts, the method further comprises:
selecting, using the computing system, another of the plurality of default cell stress layouts based on the in-design stress data of the selected instance; and
updating, using the computing system, the gate-level circuit design data such that the selected instance is associated with the other of the plurality of default cell stress layouts and its corresponding cell static timing data during routing of the gate-level circuit design; and
generating, using the computing system, an integrated circuit layout to fabricate an integrated circuit based on the updated gate-level circuit design data.

16. The method of claim 15, wherein the in-design stress parameters describe physical interactions of the selected instance with one or more other instances of the one of the plurality of cells or others of the plurality of cells.

17. The method of claim 15, wherein in response to the in-design stress data being within the tolerance of the one of the plurality of default cell stress layouts, the method further comprises:
selecting another of the instances of the one of the plurality of cells, wherein the selected other of the instances of the one of the plurality of cells is associated with the one of the plurality of default cell stress layouts.

18. The method of claim 15, wherein the one of the plurality of default cell stress layouts includes one or more layout stress parameters associated with the selected instance, wherein determining that the in-design stress data is not within the tolerance of the one of the plurality of default cell stress layouts associated with the selected instance includes comparing the in-design stress parameters to the layout stress parameters and determining that the in-design stress parameters do not match the layout stress parameters.

19. The method of claim 15, wherein before selecting one of the instances of one of the plurality of cells, the method further comprises:
routing the gate-level circuit design data; and
selecting a path through the routed gate-level circuit design data, wherein the selected instance of the one of the plurality of cells is selected from the selected path.

20. The method of claim 19, further comprising determining a timing performance for one or more paths through the routed gate-level circuit design data, wherein the selected path is one of the one or more paths that is outside a specified timing tolerance based on the timing performance of the one or more paths.

* * * * *